(12) United States Patent
Lee

(10) Patent No.: US 9,575,098 B2
(45) Date of Patent: Feb. 21, 2017

(54) ELECTRONIC APPARATUS TO DETECT POWER SUPPLY VOLTAGE LEVELS TO PROTECT PERIPHERAL CIRCUITS

(71) Applicant: SK hynix Inc., Gyeonggi-do (KR)

(72) Inventor: Hyun Chul Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/040,359

(22) Filed: Feb. 10, 2016

(65) Prior Publication Data

US 2016/0169944 A1 Jun. 16, 2016

Related U.S. Application Data

(63) Continuation of application No. 14/604,377, filed on Jan. 23, 2015, now Pat. No. 9,404,946.

(30) Foreign Application Priority Data

Aug. 22, 2014 (KR) ........................ 10-2014-0109493

(51) Int. Cl.

| G11C 8/00 | (2006.01) |
|---|---|
| G01R 19/165 | (2006.01) |
| G11C 16/26 | (2006.01) |
| G11C 16/30 | (2006.01) |
| H03K 5/24 | (2006.01) |
| G11C 5/14 | (2006.01) |
| G11C 16/22 | (2006.01) |
| G11C 15/04 | (2006.01) |
| H03K 17/22 | (2006.01) |
| G11C 16/04 | (2006.01) |

(52) U.S. Cl.

CPC ............ *G01R 19/165* (2013.01); *G11C 5/148* (2013.01); *G11C 15/046* (2013.01); *G11C 16/225* (2013.01); *G11C 16/26* (2013.01); *G11C 16/30* (2013.01); *H03K 5/2472* (2013.01); *H03K 17/223* (2013.01); *G11C 16/0483* (2013.01)

(58) Field of Classification Search
None
See application file for complete search history.

(56) References Cited

U.S. PATENT DOCUMENTS

| 7,528,644 B2 * | 5/2009 | Choi ...................... G01K 7/015 327/512 |
|---|---|---|
| 2003/0115528 A1 * | 6/2003 | Tanaka ............ G11C 29/12005 714/742 |
| 2009/0080281 A1 * | 3/2009 | Hashiba ................. G11C 5/143 365/230.06 |
| 2011/0313700 A1 * | 12/2011 | Kouno ...................... G06F 1/30 702/64 |
| 2012/0226929 A1 * | 9/2012 | Lee ..................... G06F 11/3041 713/340 |
| 2013/0147546 A1 * | 6/2013 | Lee ......................... G11C 5/147 327/543 |

\* cited by examiner

*Primary Examiner* — Son Dinh
*Assistant Examiner* — Sultana Begum
(74) *Attorney, Agent, or Firm* — IP & T Group LLP

(57) ABSTRACT

An electronic apparatus includes a first voltage detection circuit which detects when a voltage, becomes higher than a first level after the voltage starts to be supplied to a peripheral circuit, and detects when the voltage becomes lower than a second level after a supply of the voltage to the peripheral circuit starts to be interrupted, and a second voltage detection circuit which detects when the voltage becomes lower than a reference level while the peripheral circuit operates. The second level is lower than the reference level.

16 Claims, 7 Drawing Sheets

ELECTRONIC APPARATUS TO DETECT POWER SUPPLY VOLTAGE LEVELS TO PROTECT PERIPHERAL CIRCUITS

CROSS-REFERENCE TO RELATED APPLICATION

This application is a continuation of U.S. patent application Ser. No. 14/604,377 filed on Jan. 23, 2015, which claims priority to Korean patent application number 10-2014-0109493, filed on Aug. 22, 2014. The entire disclosure of the foregoing applications is incorporated herein in its entirety by reference.

BACKGROUND

Field of Invention

The present invention relates to an electronic apparatus and, more particularly, to an electronic apparatus for detecting a voltage.

Discussion of Related Art

When a power supply voltage that is supplied to peripheral circuits of an electronic apparatus stabilizes, the peripheral circuits should be initialized. On the other hand, when the power supply voltage is lower than a reference voltage, operations for protecting the peripheral circuits should be performed.

To this end, electronic apparatuses need to detect power supply voltage levels to protect peripheral circuits and secure stable operation.

SUMMARY

The present invention is directed to an electronic apparatus capable of determining whether a power supply voltage is supplied or interrupted and whether it is an unstable state or not.

One aspect of the present invention provides an electronic apparatus including a voltage detection circuit suitable for detecting when a voltage becomes higher than a first level after the voltage starts to be supplied to a peripheral circuit and detecting when the voltage becomes lower than a second level after a supply of the voltage to the peripheral circuit starts to be interrupted, and a second voltage detection circuit suitable for detecting when the voltage becomes lower than a reference level while the peripheral circuit operates, wherein the second level is lower than the reference level.

Another aspect of the present invention provides an electronic apparatus including a plurality of memory blocks each including memory cells, an operation circuit suitable for outputting operation voltages to global lines, connecting local lines of a selected memory block, among the memory blocks, to the global lines, and reading data stored in memory cells of the selected memory block through bit lines, and a voltage detection circuit suitable for detecting when a power supply voltage becomes higher than a first level after the power supply voltage starts to be supplied to the operation circuit, detecting when the power supply voltage becomes lower than a reference level while the operation circuit operates, and detecting when the power supply voltage becomes lower than a second level after a supply of the power supply voltage to the operation circuit starts to be interrupted wherein the second level is lower than the reference level.

Another aspect of the present invention provides an electronic apparatus including a power supply unit suitable for supplying an internal node with a power supply voltage, an output unit suitable for outputting a voltage detection signal based on a voltage of the internal node, and a voltage control unit suitable for controlling the voltage of the internal node in response to the voltage detection signal of the output unit.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

Hereinafter, exemplary embodiments of the invention will be described with reference to the accompanying drawings. However since the invention is not limited to the embodiments disclosed hereinafter, the embodiments of the invention should be implemented in various forms and the scope of the invention is not limited to the exemplary embodiments mentioned below. The embodiments of the invention are only provided for complete disclosure of the invention and to fully show the scope of the invention to those skilled in the art, and it should be understood that the scope of the invention is defined by the scope of the appended claims.

Figure 1:
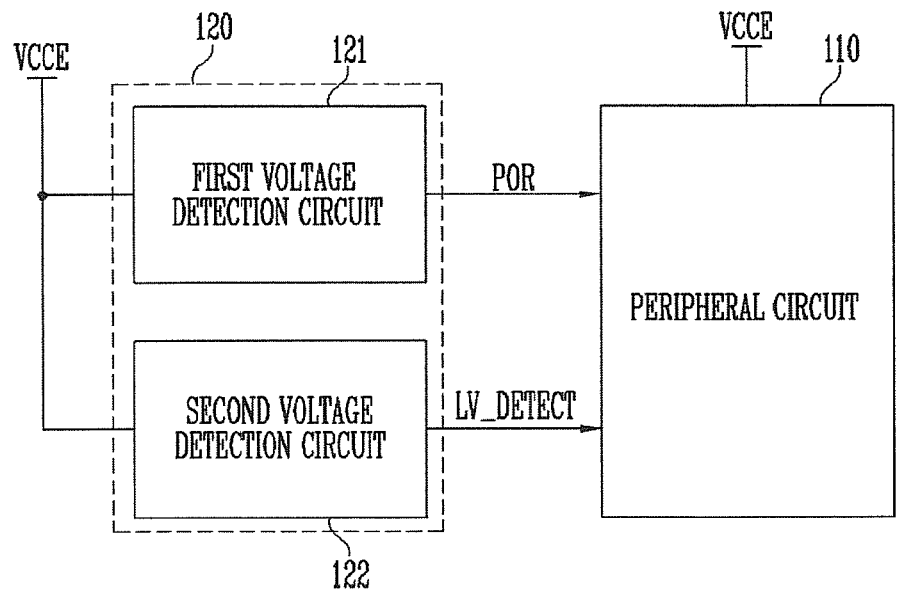
FIG. 1 is a block diagram for describing an electronic apparatus according to an exemplary embodiment of the present invention.

FIG. 1 is a block diagram for describing an electronic apparatus according to an exemplary embodiment of the present invention.

Referring to FIG. 1, the electronic apparatus includes a peripheral circuit 110 and a voltage detection circuit 120. The voltage detection circuit 120 is configured to detect when a power supply voltage VCCE becomes higher than a first level after the power supply voltage VCCE starts to be supplied to the peripheral circuit 110, detect when the power supply voltage VCCE becomes lower than a reference level while the peripheral circuit 110 operates, and detect when the power supply voltage VCCE becomes lower than a second level after the supply of the power supply voltage VCCE starts to be interrupted.

To this end, the voltage detection circuit 120 may include a first voltage detection circuit 121 and a second voltage detection circuit 122. The first voltage detection circuit 121 may be configured to detect when the power supply voltage VCCE becomes higher than the first level after the power supply voltage VCCE starts to be supplied to the peripheral circuit 110 and detect when the power supply voltage VCCE becomes lower than the second level after the supply of the power supply voltage VCCE starts to be interrupted. The second voltage detection circuit 122 may be configured to detect when the power supply voltage VCCE becomes lower than the reference level while the peripheral circuit 110 operates.

In the above-described configuration, the second level is set to be lower than the reference level. The first level and the second level are different and it is preferable that the first level be set higher than the second level. Further, it is preferable that the reference level be set higher than the first level.

The peripheral circuit 110 may perform a reset operation in response to a first voltage detection signal POR of the first voltage detection circuit 121 and perform an operation for stabilizing the power supply voltage VCCE or a discharge operation of a node to which a high voltage is applied in response to a second voltage detection signal LV_DETECT of the second voltage detection circuit 122.

The second voltage detection circuit 122 may detect when the power supply voltage VCCE is temporarily reduced as a peak current is increased by the operation of the peripheral circuit 110, and output a detection result as the second voltage detection signal LV_DETECT. Since the second voltage detection circuit 122 is configured as a well-known circuit, detailed descriptions thereof will be omitted. Hereinafter, an embodiment of the configuration and, the operation of the first voltage detection circuit 121 will be described in detail.

Figure 2:
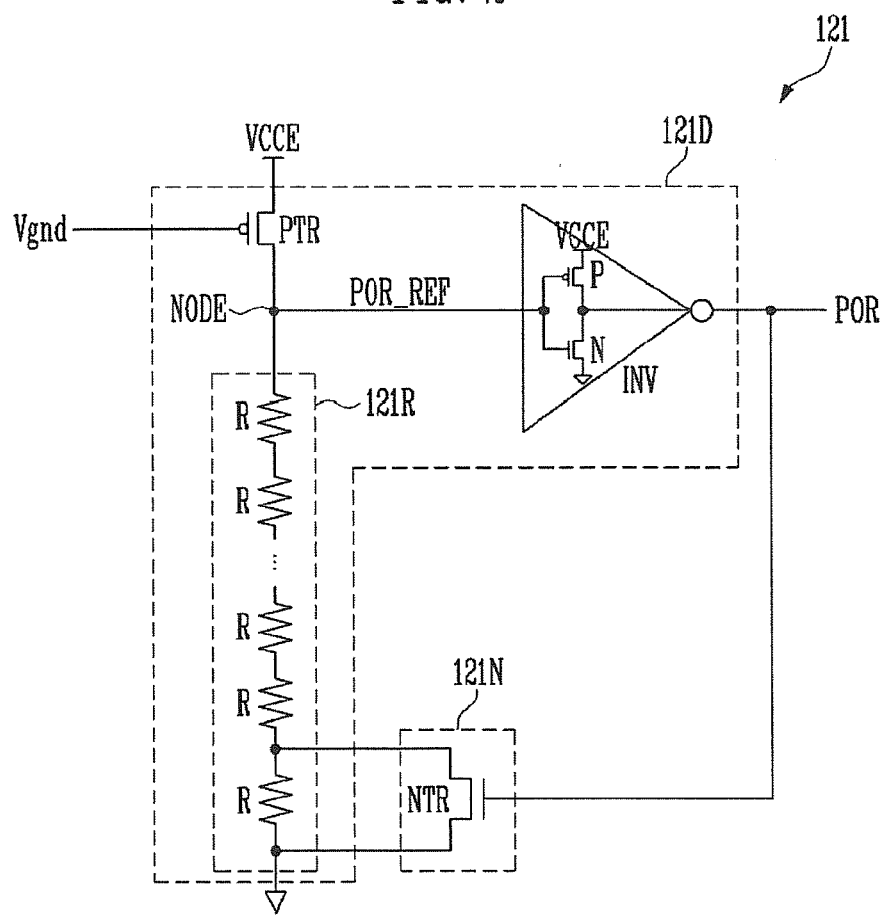
FIG. 2 is circuit diagram for describing a voltage detection circuit according to the exemplary embodiment of the present invention.
Figure 3:
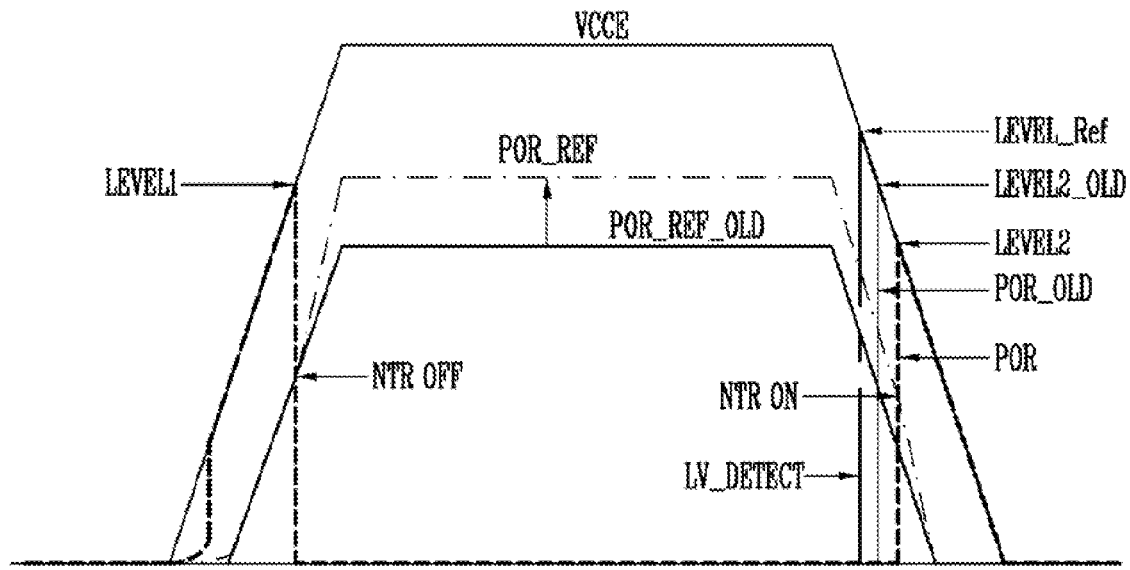
FIG. 3 is a waveform diagram for describing an operation of the voltage detection circuit of FIG. 2 according to the exemplary embodiment of the present invention.

FIG. 2 is a circuit diagram for describing a voltage detection circuit according to the exemplary embodiment of the present invention. FIG. 3 is a waveform diagram for describing an operation of the voltage detection circuit of FIG. 2 according to the exemplary embodiment of the present invention.

Referring to FIGS. 2 and 3, the first voltage detection circuit 121 may include a voltage detection unit 121D and a detection reference change unit 121N. The voltage detection unit 121D may be configured to activate a first voltage detection signal POR when the power supply voltage VCCE increases higher than a first level LEVEL1 (e.g. when it starts to be supplied and becomes higher than the first level LEVEL1). The voltage detection unit 121D may be configured to deactivate the first voltage detection signal POR when the power supply voltage VCCE decreases below a second level LEVEL2 (e.g. when it starts to be interrupted and becomes lower than the second level LEVEL2). Otherwise, the first voltage detection signal POR may change to follow the level of the power supply voltage VCCE. The detection reference change unit 121N is configured to set the second level LEVEL2 to be lower than the first level LEVEL1. Specifically, the detection reference change unit 121N is configured to s et the second level LEVEL2 to be lower than a reference level LEVEL_Ref of the second voltage detection circuit 122.

The voltage detection unit 121D may include a transistor PTR, a resistance unit 121R, and an inverter INV. The transistor PTR may be connected between a power supply voltage terminal and a node NODE and may operate based on a ground voltage Vgnd. The transistor PTR may include a PMOS transistor. The resistance unit 121R includes a plurality of resistors R connected between the node NODE and a ground terminal. The resistance values of the resistors R may be the same, or may become greater or smaller depending on the distance from the node NODE. A voltage POR_REF of the node NODE is changed based on the resistance value of the resistance unit 121R. The inverter INV including a PMOS transistor P and a NMOS transistor N outputs the first voltage detection signal POR based on the voltage POR_REF of the node NODE.

In another aspect, the transistor PTR may be a voltage supply unit configured to supply a voltage to an internal node NODE based on a level of the power supply voltage VCCE. The inverter INV may be an output unit configured to output the voltage detection signal POR based on the voltage POR_REF of the internal node NODE. The resistance unit 121R and the detection reference change unit 121N may be a voltage control unit that controls the voltage POR_REF of the internal node NODE in response to the voltage detection signal POR of the output unit INV.

When the power supply voltage VCCE becomes higher than the first level LEVEL1 (shown in FIG. 3) after starting to be supplied, the output unit INV may activate the voltage detection signal POR to a logic low level and the voltage control unit 121R and 121N may control the voltage POR_REF of the internal node NODE. Further, when the power supply voltage VCCE becomes lower than the second level LEVEL2 (shown in FIG. 3), the output unit INV may deactivate the voltage detection signal POR so that the voltage detection signal POR is changed along with the power supply voltage VCCE. Meanwhile, it is preferable that the voltage control unit 121R and 121N control the voltage POR_REF of the internal node NODE so that the second level LEVEL2 is lower than the first level LEVEL1. A detailed control method will be described later.

When the supply of the power supply voltage VCCE starts, the voltage POR_REF of the node NODE is also increased along with the power supply voltage VCCE. Since the PMOS transistor P of the inverter INV is turned on until the power supply voltage VCCE reaches the first level LEVEL1, the inverter INV outputs the first voltage detection signal POR that is changed along with the power supply voltage VCCE. The first level LEVEL1 may be a threshold voltage level of the NMOS transistor N. When the power supply voltage VCCE becomes higher than the first level LEVEL1, the NMOS transistor N is turned on and the first voltage detection signal POR is reduced to a ground level.

When the interruption of the power supply voltage VCCE starts, the power supply voltage VCCE is reduced. When the power supply voltage VCCE becomes lower than the reference level LEVEL_Ref, the peripheral circuit 110 may perform a discharge operation of the node to which a high voltage is applied in response to the second voltage detection signal LV_DETECT of the second voltage detection circuit 122.

The voltage POR_REF of the node NODE is also reduced due to a reduction of the power supply voltage VCCE. When the power supply voltage VCCE becomes lower than the second level LEVEL2, the PMOS transistor P is turned on and the first voltage detection signal POR outputted from the inverter INV is changed along with the power supply voltage VCCE.

In the above-described configuration, characteristics of a semiconductor device or threshold voltages of the transistors N and P may change depending on temperature or the manufacturing process. Because of this, the second level LEVEL2 may be changed. That is, the deactivation time point of the first voltage detection signal POR may be changed when the power supply voltage VCCE is interrupted. In a conventional, case, since a difference between the reference level LEVEL_Ref and a second level LEVEL2_OLD is not large, the second level LEVEL2_OLD may be higher than the reference level LEVEL_Ref of the second voltage detection circuit 122 depending on the temperature or the manufacturing process.

In this case, even though the power supply voltage VCCE is temporarily reduced by the operation of the peripheral circuit 110, the first voltage detection signal POR is deactivated earlier than the second voltage detection signal LV_DETECT. It is then determined that the interruption of the power supply voltage VCCE has started, and thus a malfunction of the peripheral circuit 110 may occur. Specifically, before performing discharge operations of the nodes to which a high voltage is applied in response to the second voltage detection signal LV_DETECT, the peripheral circuit 110 responds to the first voltage detection signal POR, and thus operations of internal components may be terminated. Because of this, the high voltage applied to the node of the peripheral circuit 110 is not discharged, and the high voltage may adversely affect the internal components of the peripheral circuit 110.

In order to prevent this, it is necessary to further lower the second level LEVEL2. It is preferable that the first level LEVEL1 be maintained and only the second level LEVEL2 be reduced. The detection reference change unit 121N is configured to set the second level LEVEL2 to be lower than the reference level LEVEL_Ref and the first level LEVEL1. To this end, the detection reference change unit 121N is configured to change the resistance value of the resistance unit 121R of the voltage detection unit 121D connected to the ground terminal in response to the first voltage detection signal POR. As an example, the detection reference change unit 121N may include a transistor NTR which connected in parallel to the resistor R of the resistance unit 121R and operates in response to the first voltage detection signal POR.

The detection reference change unit 121N is turned on in response to the first voltage detection signal POR while the power supply voltage VCCE is increased to the first level LEVEL1 after starting to be supplied. Therefore, the resistor R of the resistance unit 121R connected in parallel to the detection reference change unit 121N does not affect a total resistance of the resistance unit 121R and the voltage POR_REF of the node NODE. When the voltage POR_REF of the node NODE becomes higher than the first level LEVEL1, the NMOS transistor N is turned on and the first voltage detection signal POR is reduced to the ground level (or the logic low level). As a result, the detection reference change unit 121N is turned off in response to the first voltage detection signal POR, and the total resistance of the resistance unit 121R is increased. Therefore, the voltage POR_REF of the node NODE becomes higher than a voltage POR_REF_OLD in a case that the detection reference change unit 121N is not included.

The second level LEVEL2 is lower than the second level LEVEL2_OLD in a case that the detection reference change unit 121N is not included because the voltage POR_REF of the node NODE is higher than the voltage POR_REF_OLD. More specifically, when the detection reference change unit 121N is not included and the power supply voltage VCCE is at the second level LEVEL2_OLD the PMOS transistor P may be turned on based on the voltage POR_REF_OLD. However, when the detection reference change unit 121N is included and the power supply voltage VCCE is at the second level LEVEL2_OLD, the PMOS transistor P may not be turned on based on the voltage POR_REF higher than the voltage POR_REF_OLD. The PMOS transistor P may be turned on when the power supply voltage VCCE is lowered to the second level LEVEL2. Therefore, the second level LEVEL2 becomes lower than the second level LEVEL2_OLD. The second level LEVEL2 may be determined based on the voltage POR_REF of the node NODE and a threshold voltage of the PMOS transistor P.

When the PMOS transistor P is turned on, the first voltage detection signal POR is changed along with the power supply voltage VCCE and the detection reference change unit 121N is turned on again.

As described above, the second level LEVEL2 becomes lower than the first level LEVEL1 as well as the reference level LEVEL_Ref due to the detection reference change unit 121N and the resistor R of the resistance unit 121R connected in parallel thereto. Therefore, since a difference between the second level LEVEL2 and the reference level LEVEL_Ref is increased, the second level LEVEL2 is prevented from becoming higher than the reference level LEVEL_Ref due to temperature and process conditions.

Hereinafter, an electronic apparatus according to another exemplary embodiment of the present invention will be described.

Figure 4:
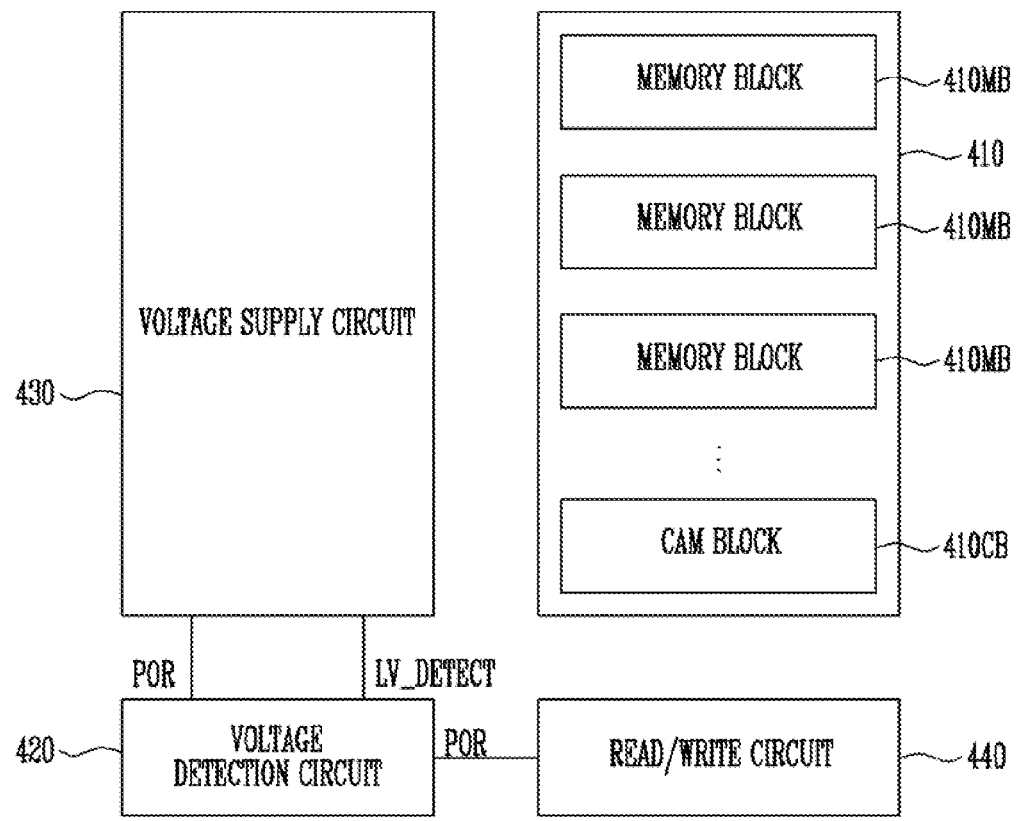
FIG. 4 is a block diagram for describing an electronic apparatus according to another exemplary embodiment of the present invention.

FIG. 4 is a block diagram for describing an electronic apparatus according to another exemplary embodiment of the present invention.

Referring to FIG. 4, the electronic apparatus includes a memory array 410 and operation circuits 430 and 440. The memory array 410 includes a plurality of memory blocks 410MB. Some of the memory blocks 410MB may be used as a cam block 410CB. A structure of the memory block 410MB will be described below.

Figure 5:
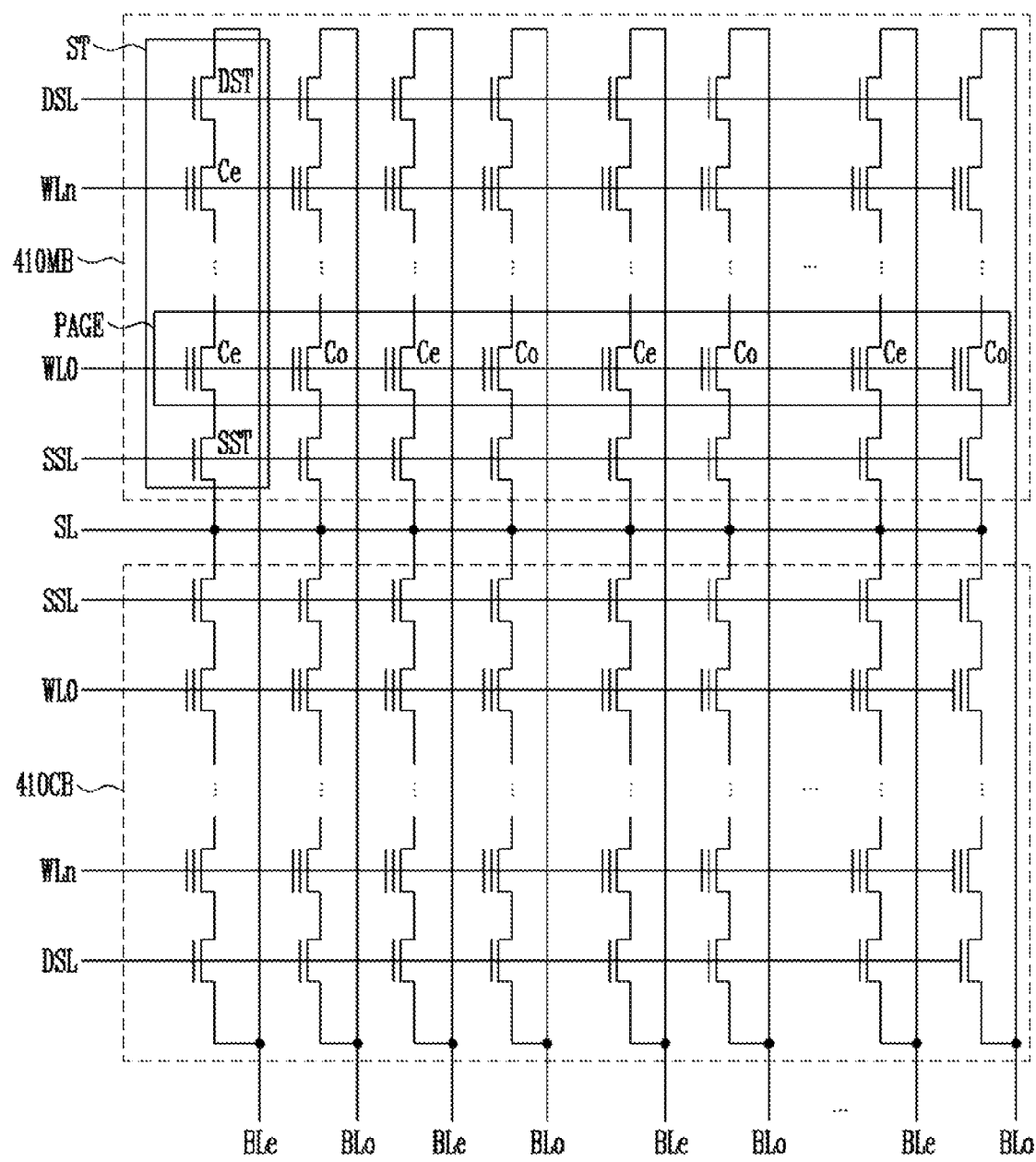
FIG. 5 is circuit diagram for describing a memory array of FIG. 4.

FIG. 5 is a circuit diagram for describing the memory array 410 of FIG. 4.

Referring to FIG. 5, the structure of the memory block 410MB is the same as the structure, of the cam block 410CB. Data of a user may be stored in the memory blocks 410MB and parameters related to operation conditions may be stored n the cam block 410CB. Specifically, detection level setting data may be stored in the cam block 410CB, and the detection level setting data may be used for setting a level at which the power supply voltage is detected. This will be described in detail later.

The memory block 410MB or the cam block 410CB includes a plurality of memory strings ST connected between bit lines BLe and BLo and a common source line SL. That is, the memory strings ST are each connected to the corresponding bit line BLe (or BLo) and connected in common to the common source line SL. Each memory string ST includes a source select transistor SST of which a source is connected to the common source line SL, a cell string in which a plurality of memory cells Ce (or Co) are connected in series, and a drain select transistor DST of which a drain is connected to the bit line BLe or BLo). The memory cells Ce included in the cell string ST are connected in series between the select transistors SST and DST. A gate of the source select transistor SST is connected to the source select line SSL, and gates of the memory cells Ce are connected to word lines WL0 to WLn, respectively, and a gate of the drain select transistor DST is connected to the drain select line DSL.

The drain select transistor DST controls the connection or disconnection of the cell string ST to or from the bit line BLe, and the source select transistor SST controls the connection or disconnection of the cell string ST to or from the common source line SL.

In a NAND flash memory device, memory cells included in a memory cell block may be classified in units of physical pages or logical pages. For example, memory cells Ce and Co connected to one word line (e.g., WL0) configure one physical page. Even-numbered memory cells Ce connected to one word line (e.g., WL0) may configure one even physical page and odd-numbered memory cells Co may configure one odd physical page. The page (or, even page and odd page) may be a basic unit of a program operation or a read operation.

Referring again to FIGS. 4 and 5, the operation circuits 430 and 440 are configured to perform a program loop, an erase loop, and a read operation of the memory cells Ce and Co connected to the selected word line (e.g., WL0). The program loop includes a program operation and a verify operation, and the erase loop includes an erase operation and a verify operation.

In order to perform the program loop, the erase loop and the read operation, the operation circuits 430 and 440 are configured to selectively output operation voltages to the local lines SSL, WL0 to WLn and DSL and the common source line SL of the selected memory block, and control precharge/discharge of the bit lines BLe and BLo or sense current flow or a voltage change) of the bit lines BLe and BLo.

In the case of a NAND flash memory device, an operation circuit includes a voltage supply circuit 430 and a read/write circuit 440. The operation circuit may further include a voltage detection circuit 420 to detect (or sense) a level (or change) of a power supply voltage applied to the operation circuits 430 and 440. Each component will be described in detail below.

The voltage supply circuit 430 generates operation voltages needed for the program loop, the erase loop, and the read operation of the memory cells. Here, the operation voltages may include a program voltage, a read voltage, an erase voltage a pass voltage a select voltage, a common source voltage, and so on. The voltage supply circuit 430 outputs the operation voltages to the local lines SSL, WL0 to WLn and DSL and the common source line SL of the selected memory block in response to a row address signal (not shown). Details of a connection relation and a voltage application method will be described later in FIG. 6.

The read/write circuit 440 may include a plurality of page buffers (not shown) connected to the memory array 410 through the bit lines BLe and BLo. Specifically, the page buffers may be connected to the bit lines BLe and BLo, respectively. That is, one page buffer may be connected to one bit line. When the program operation is performed, the read/write circuit 440 selectively precharges the bit lines BLe and BLo. When the program verify operation or the read operation is performed, the read/write circuit 440 precharges the bit lines BLe and BLo, and the read/write circuit 440 senses a voltage change or current of the bit lines BLe and BLo and latches data read from the memory cell after the voltage supply circuit 430 applies the operation voltages to the selected memory block 410MB.

The voltage detection circuit 420 is configured to detect (or sense) the level of the power supply voltage applied to the operation circuits 430 and 440. As an example, the voltage detection circuit 420 is configured to detect when the power supply voltage becomes higher than a first level after the power supply voltage starts to be supplied to the operation circuits 430 and 440, detect when the power supply voltage becomes lower than a reference level while the operation circuits 430 and 440 operate and detect when the power supply voltage becomes lower than a second level after the supply of the power supply voltage starts to be interrupted. As described in FIG. 3, the second level is set to be lower than the reference level. It is preferable that the second level be set lower than the first level and the first level be set lower than the reference level.

Figure 6:
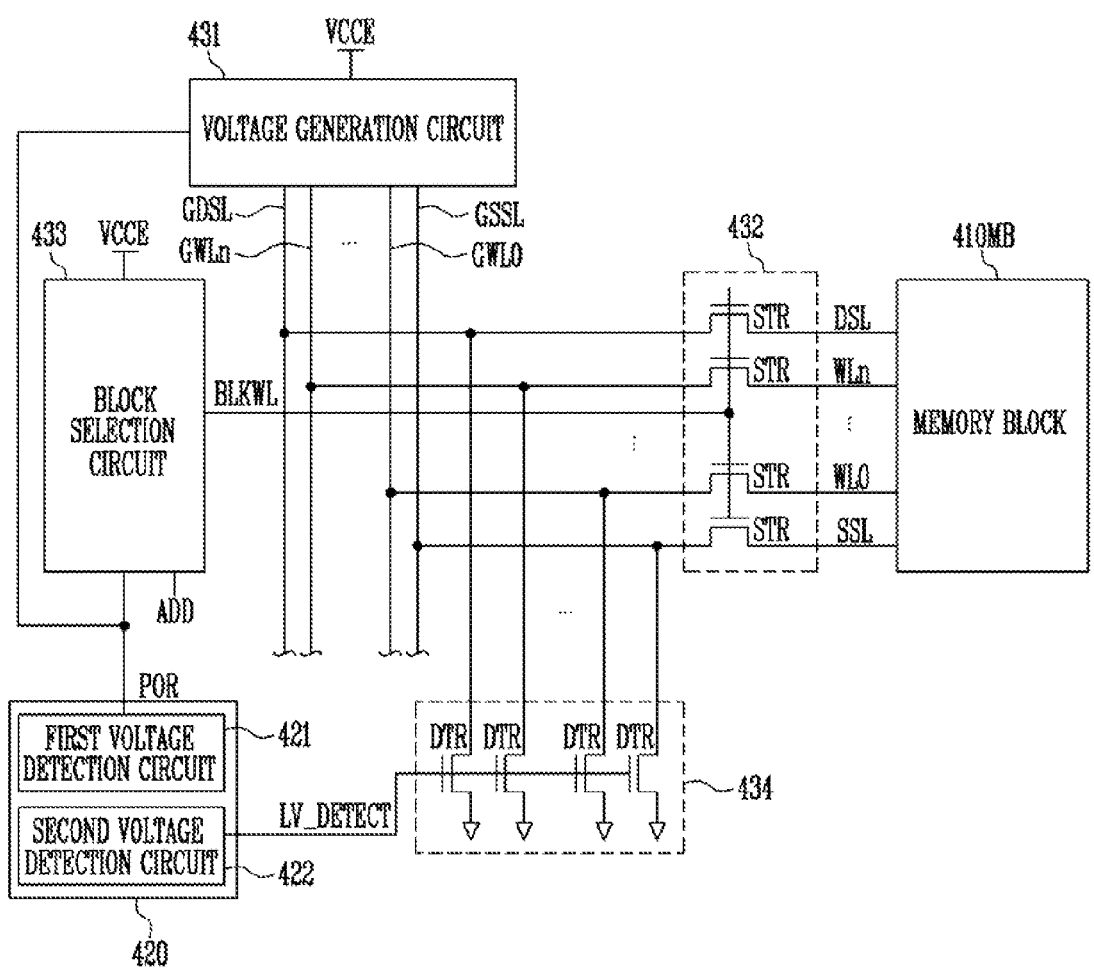
FIG. 6 is a circuit diagram for describing an electronic apparatus according to an exemplary embodiment of the present invention.

Hereinafter, a relation of connecting the memory block to the operation circuit will be described in more detail. FIG. 6 is a circuit diagram for describing an electronic apparatus according to an embodiment of the present invention.

Referring to FIG. 6, a voltage supply circuit includes a voltage generation circuit 431, a connection circuit 432, and a block selection circuit 433. The voltage generation circuit 431 outputs operation voltages needed for the program loop, the erase loop or the verify operation to the global lines GSSL, GWL0 to GWLn, and GDSL. The block selection circuit 433 outputs a block selection signal BLKWL in response to an address signal ADD (e.g., a row address signal). The connection circuit 432 connects local lines SSL, WL0 to WLn, and DSL of the selected memory block 410MB to the global lines GSSL, GWL0 to GWLn and GDSL in response to the block selection signal BLKWL. The connection circuit 432 may include transistors STR, which are provided for each memory block, connected between the global lines GSSL, GWL0 to GWLn, and GDSL and the local lines SSL, WL0 to WLn, and DSL of the memory block 410MB, and operate in response to the block selection signal BLKWL.

The electronic apparatus may further include a discharge circuit 434. When the program operation, the read operation, or the verify operation ends, or when the interruption of the power supply voltage starts, the discharge circuit 434 may discharge the global lines GSSL, GWL0 to GWLn, and GDSL to which a high voltage is applied.

The voltage detection circuit 420 is configured to detect (or sense a level (or change) of a power supply voltage VCCE applied to the operation circuit. As described in FIG. 1, the voltage detection circuit 420 may include a first voltage detection suit 421 and a second voltage detection circuit 422.

The first voltage detection circa it 421 is configured to detect when the power supply voltage VCCE becomes higher than the first level LEVEL1 (shown in FIG. 3) after the power supply voltage VCCE starts to be supplied to the operation circuits 431 and 433, and detect when the power supply voltage VCCE becomes lower than the second level LEVEL2 (shown in FIG. 3) after the supply of the power supply voltage VCCE starts to be interrupted. The second voltage detection circuit 422 is configured to detect when the power supply voltage VCCE becomes lower than the reference level LEVEL_Ref (shown in FIG. 3) while the operation circuits 431 and 433 operate.

The operation circuits 431 and 433 may perform a reset operation in response to a first voltage detection signal POR of the first voltage detection circuit 421, and the discharge circuit 434 may perform a discharge operation of a node (e.g., the global lines) to which a high voltage is applied in response to a second voltage detection signal LV_DETECT of the second voltage detection circuit 422 activated when the power supply voltage VCCE becomes lower than the reference level.

The first voltage detection circuit 421 and the second voltage detection circuit 422 described above may operate in the same manner as the first voltage detection circuit 121 and the second voltage detection circuit 122 described in FIG. 1. However, the first voltage detection circuit 421 may be configured differently from the first voltage detection circuit 121 described in FIG. 2 as follows.

Figure 7:
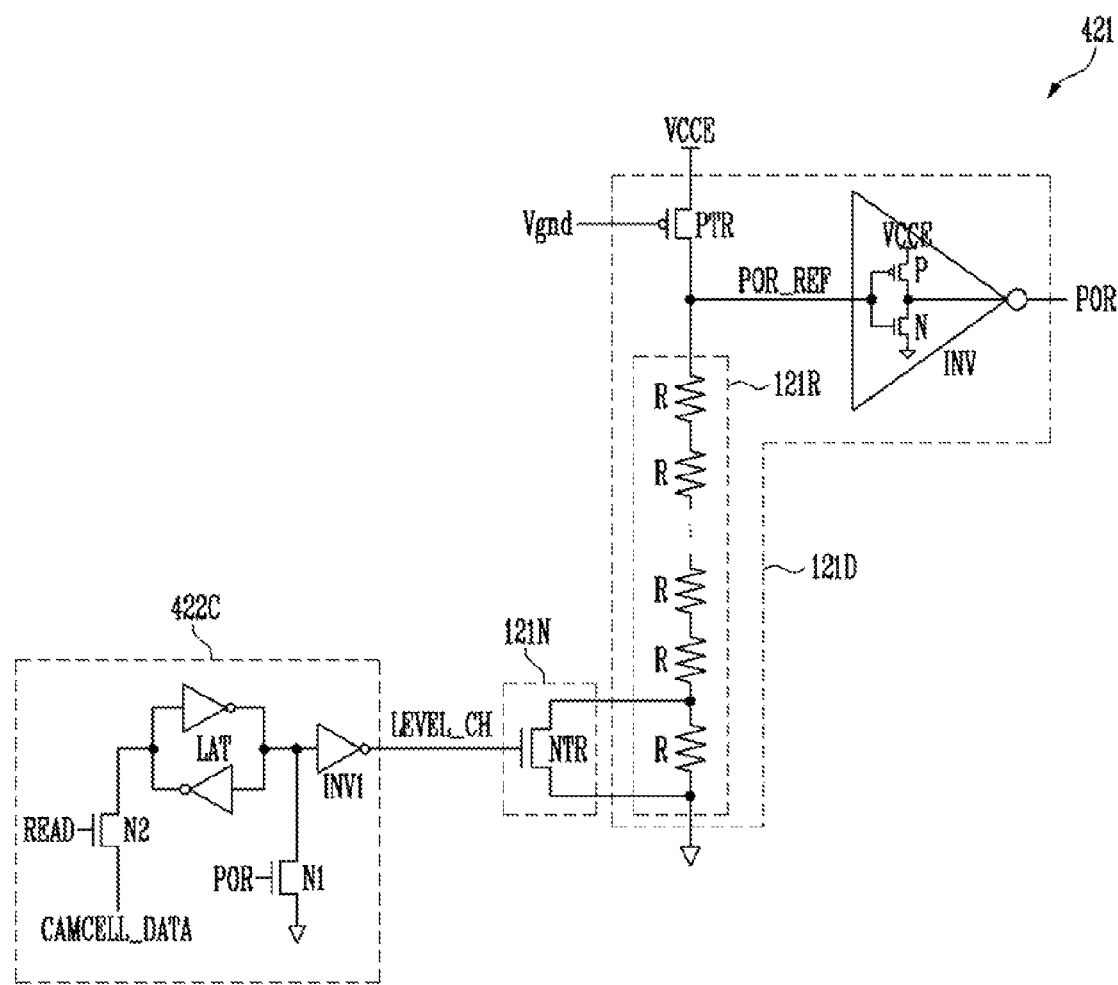
FIG. 7 is a circuit diagram for describing a voltage detection circuit according to another exemplary embodiment of the present invention.

FIG. 7 is a circuit diagram for describing a voltage detection circuit according to another exemplary embodiment of the present invention.

Referring to FIG. 7, a first voltage detection circuit 421 includes a voltage detection unit 121D, a detection reference control unit 422C and a detection reference change unit 121N.

The voltage detection unit 121D is configured to output a first voltage detection signal POR which is changed along with a power supply voltage VCCE before the power supply voltage VCCE becomes higher than a first level or after the power supply voltage VCCE becomes lower than a second level. The detection reference change unit 121N is configured to change an internal resistance value of a resistance unit 121R of the voltage detection unit 121D in response to a detection level change signal LEVEL_CH, in order to set the second level lower than a reference level and the first level. That is, the detection reference change unit 121N is configured to change the internal resistance value of the resistance unit 121R of the voltage detection unit 121D connected to a ground terminal in response to the detection level change signal LEVEL_CH.

The voltage detection unit 121D and the detection reference change unit 121N are configured in the same manner as the voltage detection unit 121D and the detection reference change unit 121N shown in FIG. 2. However, the detection reference change unit 121N operates in response to the detection level change signal LEVEL_CH, which is an output signal of the detection reference control unit 422C, rather than the first voltage detection signal POR.

The detection reference control unit 422C is configured to output the detection level change signal LEVEL_CH in response to detection level setting data CAMCELL_DATA read from the memory block (specifically, the cam block). The detection level setting data CAMCELL_DATA is stored in any one of the memory blocks (preferably the cam blocks). The operation circuit reads the detection level setting data CAMCELL_DATA from the cam block and then provides the detection level setting data CAMCELL_DATA to the detection reference control unit 422C.

The detection reference control unit 422C includes a transfer circuit N2, a latch LAT, an initialization unit N1, and an output circuit INV1. The transfer circuit N2 is configured to transfer the detection level setting data CAMCELL_DATA read from the memory block in response to a latch signal READ. The transfer circuit N2 may include an NMOS transistor, which operates in response to the latch signal READ.

The latch LAT latches the detection level setting data CAMCELL_DATA transferred through the transfer circuit N2. The initialization unit N1 is configured to initialize the latch LAT in response to the first voltage detection signal POR. The initialization unit N1 may include an NMOS transistor that is connected between an output terminal of the latch LAT and a ground terminal and operates in response to the first voltage detection signal POR.

The output circuit INV1 is configured to output the detection level change signal LEVEL_CH based on the detection level setting data CAMCELL_DATA latched to the latch LAT. The output circuit INV1 may include an inverter connected the output terminal of the latch LAT.

As described above, the detection reference change unit 121N may operate based on the detection level setting data CAMCELL_DATA stored in the cam block rather than the first voltage detection signal POR. That is the detection reference change unit 121N may selectively change a resistance value of the resistance unit 121R included in the voltage detection unit 121D based on the detection level setting data CAMCELL_DATA stored in the cam block. That is, a reference for determining the interruption of the power supply voltage VCCE may be the second level LEVEL2_OLD (shown in FIG. 3) or the second level LEVEL2 (shown in FIG. 3) depending on the detection level setting data CAMCELL_DATA stored in the cam block.

When the reference for determining the interruption of the power supply voltage VCCE is the second level LEVEL2 (shown in FIG. 3), the second level LEVEL2 becomes lower than the first level LEVEL1 and the reference level LEVEL_Ref as described in FIG. 3.

Figure 8:
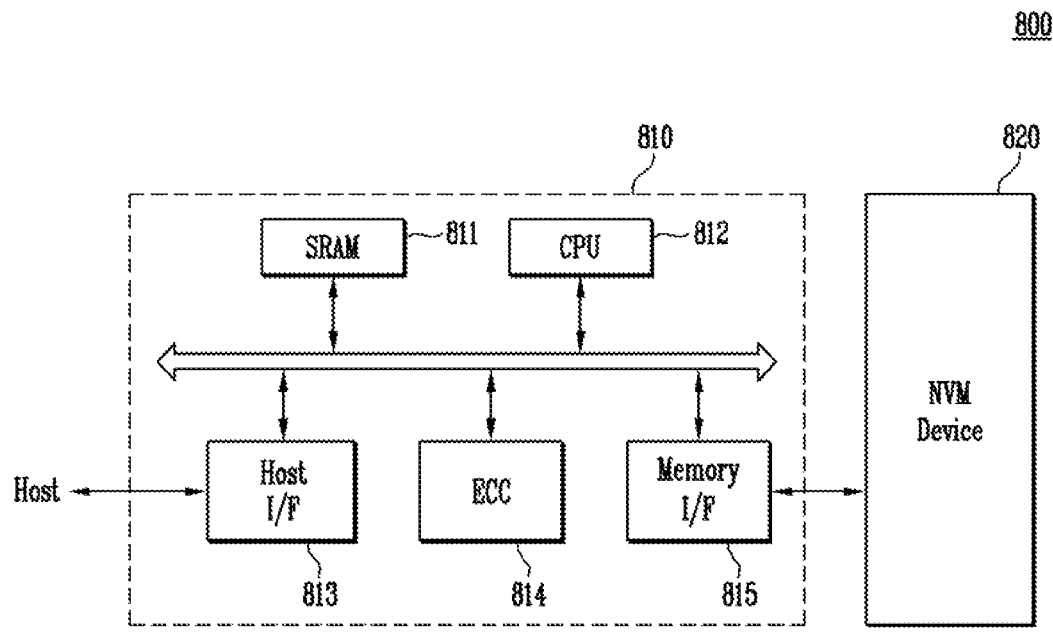
FIG. 8 is a block diagram showing a memory system according to the embodiments of the present invention.

FIG. 8 is a block diagram showing a memory system according to the embodiments of the present invention.

Referring to FIG. 8, the memory system 800 according to the embodiment of the present invention includes a non-volatile memory device 820 and a memory controller 810.

The non-volatile memory device 820 may correspond to the electronic apparatus shown in FIG. 4, and include the voltage detection circuit shown in FIG. 2 or FIG. 7. The memory controller 810 may be configured to control the non-volatile memory device 820. A memory card or a semiconductor disk device, that is, a solid state disk (SSD), may be provided by a combination of the non-volatile memory device 820 and the memory controller 810. A static random access memory (SRAM) 811 is used as an operation memory of a central processing unit 812. A host interface 813 has a data exchanging protocol of a host Host, which is connected to the memory system 800. An error correction code block 814 detects and corrects an error included in data read out from the non-volatile memory device 820. A memory interface 815 interfaces with the non-volatile memory device 820 according to the embodiments of the present invention. The central processing unit 812 performs overall control operations for data exchanging of the memory controller 810.

Although not shown in the drawings, it is apparent to those skilled in the art that the memory system 800 according to the embodiments of the present invention further includes a read only memory (ROM) (not shown) or the like which stores code data for interfacing with the host Host. The non-volatile memory device 820 may be provided as a multi-chip package including a plurality of flash memory chips. The memory system 800 according to the embodiments of the present invention may be provided as a storage medium having high reliability, and improved operation characteristics. Particularly, the flash memory device according to the embodiment of the present invention may be included in a memory system such as a semiconductor disk device, that is, an SSD, on which research has been actively conducted. In this case, the memory controller 810 may be configured to communicate with the outside (e.g., a host Host) through one of various interface protocols such as a Universal Serial Bus (USB) protocol, a MultiMediaCard (MMC) protocol, a Peripheral Component Interconnect Express (PCI-E) protocol, an Serial Advanced Technology Attachment (SATA) protocol, a Parallel Advanced Technology Attachment (DATA) protocol, an Enhanced Small Disk Interface (ESDI) protocol, an Integrated Drive Electronics (IDE) protocol, and so on.

Figure 9:
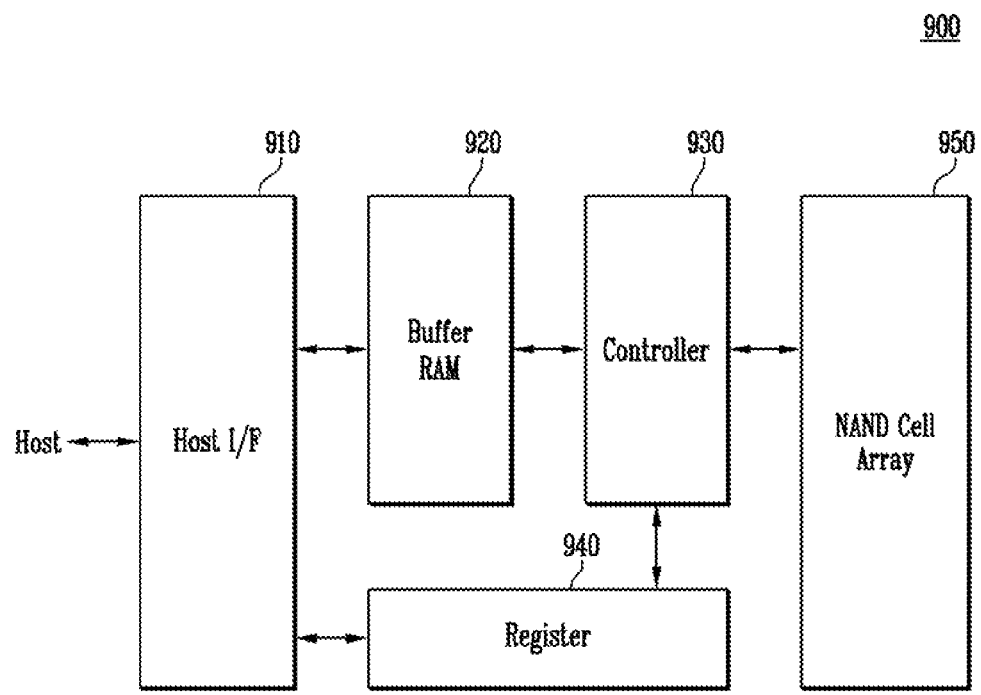
FIG. 9 is a block diagram showing a fusion memory device or a fusion memory system configured to execute a program operation according to the embodiments of the present invention.

FIG. 9 is a block diagram showing a fusion memory device or a fusion memory system which, performs a program operation according to the embodiments of the present invention. For example, the embodiments of the present invention may be applied to a OneNAND flash memory device 900 as a fusion memory device.

The OneNAND flash memory device 900 includes a host interface 910 which exchanges information with a device which uses different protocols, a buffer RAM 920 which embeds a code for driving the memory device or temporarily stores data, a controller 930 which controls a read, a program, and all statuses in response to a control signal and a command received from the outside, a register 940 which stores data such as, a command, an address, configuration information in which a system operation environment of the inside of the memory device is defined, and so on, and a NAND flash cell array 950 comprised of an operation circuit including a non-volatile memory cell and a page buffer. The OneNAND flash memory device 900 programs the data in a general method in response to a write request from the host Host.

Figure 10:
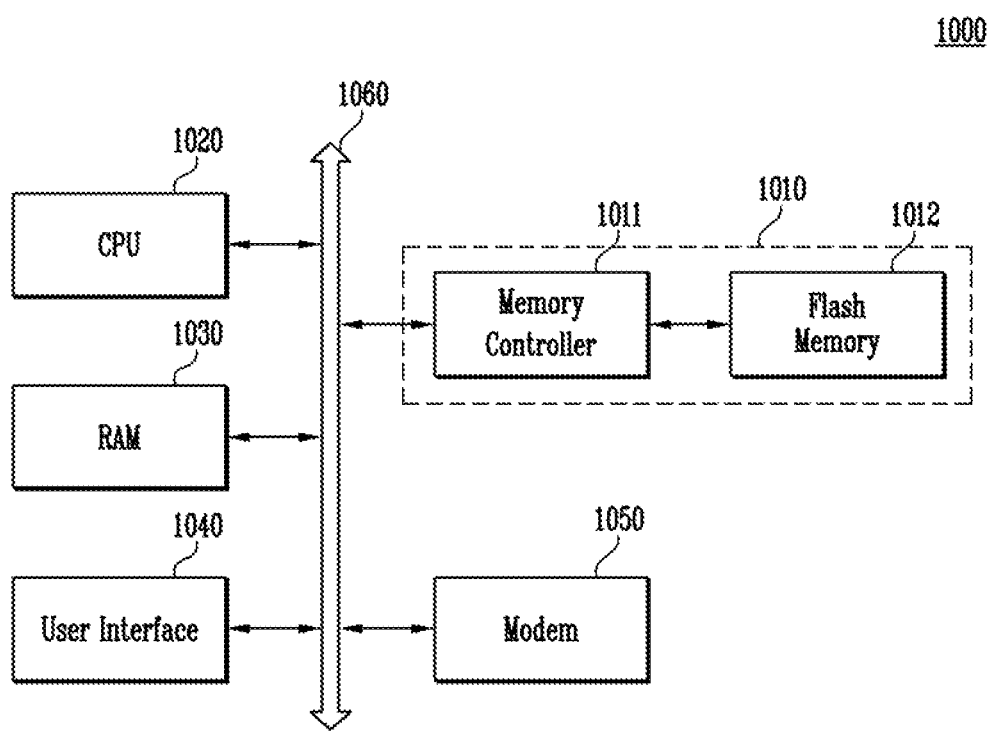
FIG. 10 is a block diagram showing a computing system including a flash memory device according to the embodiments of the present invention.

FIG. 10 is a block diagram showing a computing system including a flash memory device 1012 according to the embodiments of the present invention.

The computing system 1000 according to the embodiments of the present invention includes a microprocessor 1020, a RAM 1030, a user interface 1040, a modem 1050 such as a baseband chipset, and a memory system 1010 connected electrically to a system bus 1060. When the computing system 1000 according to the embodiments of the present invention is a mobile device, a battery (not shown) for supplying an operation voltage of the computing system 1000 may be further provided. Although not shown in the drawings, it is apparent to those skilled in the art that an application chipset, a camera image processor (CIS), a mobile DRAM, and so on may be further provided in the computing system 1000 according to the embodiments of the present invention. The memory system 1010, for example, may be configured as a solid state drive/disk (SSD) using the non-volatile memory device described in FIG. 8 to store data. Alternatively, the memory system 1010 may be provided as a fusion memory device (for example, a OneNAND flash memory device described in FIG. 9).

According to the embodiments of the present invention, an electronic apparatus can accurately determine whether a power supply voltage is supplied or interrupted and whether it is unstable state.

In the drawings and specification, there have been disclosed exemplary embodiments of the invention, and although specific terms are employed, they are used in a generic and descriptive sense only and not for the purpose of limitation. As for the scope of the invention, it is to be set forth in the following claims Therefore it will be understood by those of ordinary skill in the art that various changes in form and detail may be made therein without departing from the spirit and scope of the present invention as defined by the following claims.

What is claimed is:

1. An electronic apparatus, comprising:
a voltage supply unit configured to supply a voltage to an internal node based on a level of a power supply voltage;
an output unit configured to output a voltage detection signal according to a voltage level of the internal node; and
a voltage control unit configured to control the voltage of the internal node by changing a resistance value of a resistance unit connected between the internal node and a ground terminal in response to the voltage detection signal of the output unit,
wherein the voltage control unit comprises:
a resistance unit configured to include a plurality of resistors; and
a detection reference change unit configured to receive the voltage detection signal from the output unit and to change resistance value of the resistance unit according to the voltage detection signal,
wherein the detection reference change unit comprises a transistor which is connected in parallel to at least one resistor of the resistance unit, and
the transistor is turned on while the power supply voltage is increased to a first level after starting to be supplied.

2. The electronic apparatus of claim 1, wherein the output unit further configured to output the voltage detection signal when the voltage level of the internal node becomes higher than flail the first level after the power supply voltage starts to be increased or lower than a second level after the power supply voltage starts to be decreased.

3. The electronic apparatus of claim 2, wherein the first level is higher than the second level.

4. The electronic apparatus of claim 1, wherein the voltage detection signal determines when a reset operation of the power supply voltage is performed.

5. The electronic apparatus of claim 1, wherein the transistor is turned off in response to the voltage detection signal to increase the voltage level of the internal node.

6. The electronic apparatus of claim 1, wherein the transistor is turned on while the power supply voltage is decreased below the second level after starting to be decreased.

7. An electronic apparatus, comprising:
a memory array configured to include a plurality of memory blocks;
a voltage supply circuit configured to apply a plurality of operation voltages to perform a program operation, an erase operation and a read operation on the memory array; and
a voltage detection circuit configured to detect a level of a power supply voltage applied to the Hall voltage supply circuit by changing an internal resistance value,
wherein the voltage detection circuit comprises:
a voltage detection unit configured to output a voltage detection signal which is changed along with the power supply voltage before the power supply voltage becomes higher than a first level or after the power supply voltage becomes lower than a second level;
a detection reference control unit configured to output a detection level change signal based on the voltage detection signal or detection level setting data read from one memory block of the plurality of the memory blocks; and
a detection reference change unit configured to change the internal resistance value of the voltage detection unit in response to the detection level change signal, wherein the detection reference change unit comprises a transistor which is connected in parallel to at least one resistor of the resistance unit, and the transistor is turned on while the power supply voltage is increased to a first level after starting to be supplied.

8. The electronic apparatus of claim 7, wherein the voltage detection signal determines when a reset operation of the power supply voltage is performed.

9. The electronic apparatus of claim 7, wherein the first level is higher than the second level.

10. The electronic apparatus of claim 7, wherein the one memory block of the plurality of the memory blocks is CAM (Content Addressable Memory) block.

11. The electronic apparatus of claim 7, wherein the voltage detection unit comprises
  a voltage supply unit configured to supply a voltage to an internal node based on the level of the power supply voltage;
  an output unit configured to output the voltage detection signal according to the voltage level of the internal node; and
  a resistance unit configured to include a plurality of resistors which determine the voltage level of the internal node.

12. The electronic apparatus of claim 11, wherein the detection reference change unit comprises a transistor which is connected in parallel to at least one resistor of the resistance unit of the voltage detection unit.

13. The electronic apparatus of claim 7, wherein the detection reference control unit outputs the voltage detection signal while the power supply voltage is increased to the first level after starting to be supplied.

14. The electronic apparatus of claim 7, wherein the detection reference control unit outputs the detection level change signal based on the detection level setting data, which determines the internal resistance value of the voltage detection unit.

15. The electronic apparatus of claim 11, the transistor is turned off in response to the voltage detection signal to increase the voltage level of the internal node.

16. The electronic apparatus of claim 11, wherein the transistor is turned on while the power supply voltage is decreased below the second level after starting to be decreased.

* * * * *